(12) United States Patent
Wilson et al.

(10) Patent No.: US 7,414,844 B2
(45) Date of Patent: Aug. 19, 2008

(54) LIQUID COOLED HEAT SINK WITH COLD PLATE RETENTION MECHANISM

(75) Inventors: Michael J. Wilson, Racine, WI (US);
Jonathan Wattelet, Gurnee, IL (US);
Donald Lightner, Franksville, WI (US);
Richard DeKeuster, Racine, WI (US);
Ernest H. Dubble, Lancaster, PA (US);
Gregg J. Baldassarre, Lititz, PA (US)

(73) Assignee: Thermal Corp., Wilmington, DE (US)

( * ) Notice: Subject to any disclaimer, the term of this patent is extended or adjusted under 35 U.S.C. 154(b) by 0 days.

(21) Appl. No.: 11/637,633

(22) Filed: Dec. 12, 2006

(65) Prior Publication Data

US 2007/0188991 A1 Aug. 16, 2007

Related U.S. Application Data

(63) Continuation of application No. 11/220,456, filed on Sep. 7, 2005, now Pat. No. 7,149,087.

(60) Provisional application No. 60/607,933, filed on Sep. 8, 2004.

(51) Int. Cl.
*H05K 7/20* (2006.01)
(52) U.S. Cl. .................. 361/699; 361/701; 361/702; 361/704; 257/714; 257/718; 165/80.4; 174/15.1
(58) Field of Classification Search .............. None
See application file for complete search history.

(56) References Cited

U.S. PATENT DOCUMENTS 5,966,288 A * 10/1999 Batten et al. ............... 361/704
6,791,838 B1 * 9/2004 Hung et al. ................ 361/704

* cited by examiner

*Primary Examiner*—Boris L Chervinsky
(74) *Attorney, Agent, or Firm*—Michael Best & Friedrich

(57) ABSTRACT

A system for cooling electronic components with a surface having one or more electronic components, including an integrated circuit, mounted thereon. A liquid cooled heat exchanger located in overlying contacting relation with the integrated circuit. A resilient cold plate coupled to the surface so as to be biased by a portion of the liquid cooled heat exchanger thereby providing a forced engagement between the liquid cooled heat exchanger, the integrated circuit, and the resilient cold plate.

19 Claims, 9 Drawing Sheets

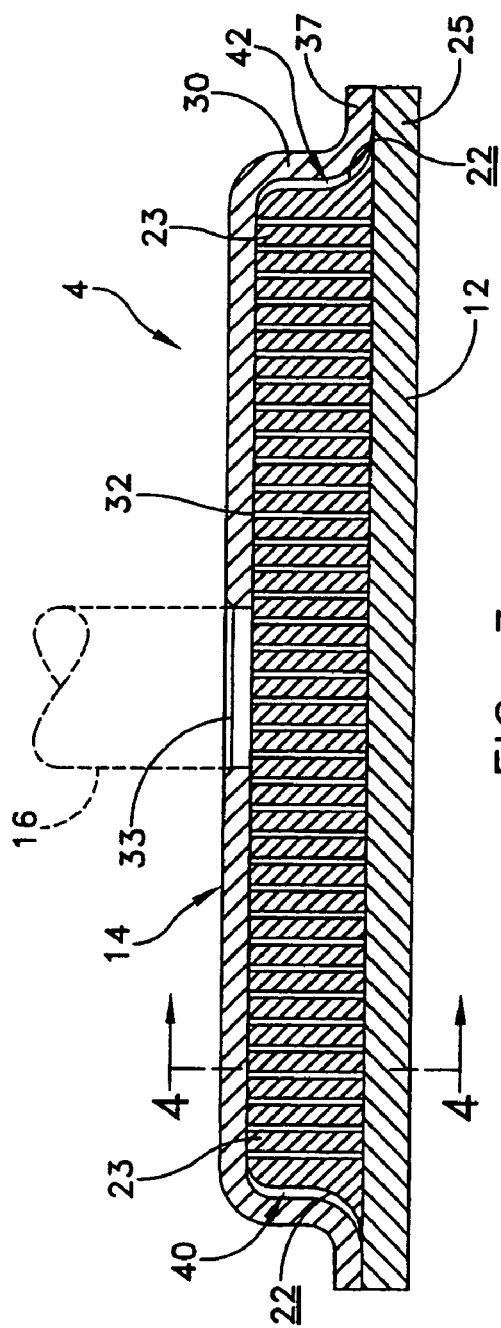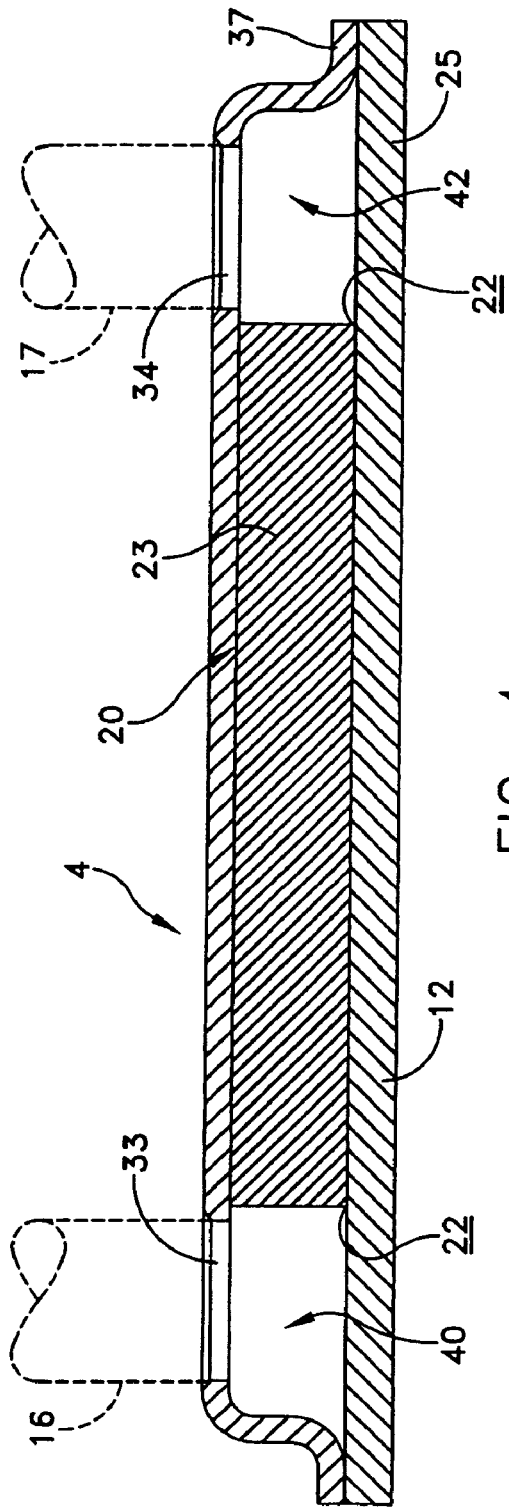

LIQUID COOLED HEAT SINK WITH COLD PLATE RETENTION MECHANISM

RELATED APPLICATIONS

This is a Continuation of U.S. patent application Ser. No. 11/220,456, filed Sep. 7, 2005, now U.S. Pat. No. 7,149,087, and claims benefit of U.S. provisional patent application Ser. No. 60/607,933, filed Sep. 8, 2004. The entire contents of the preceding patent applications are incorporated herein by reference.

FIELD OF THE INVENTION

The present invention generally relates to thermal management for memory modules and, more particularly, to a liquid cooled heat sink and cold plate retention mechanism.

BACKGROUND OF THE INVENTION

As the power to be dissipated by semiconductor devices increases with time, a problem arises: over time the thermal conductivity of the available materials becomes too low to conduct the heat from the semiconductor device to the fins with an acceptably low temperature drop. The thermal power density emerging from the semiconductor devices will be so high that even copper or silver spreader plates will not be adequate. Compounding this problem is that circuit boards are typically housed in enclosures that are increasingly becoming smaller in size.

For relatively low-power systems, air cooling and heat sink techniques often adequately maintain lower operating temperatures to such electronic components. Application of printed circuit boards that employ high power electronic components demanded by such equipment used, often require liquid cooling to minimize the cooling system size, and heat transfer medium required transmitting larger amount of heat rate using relatively smaller size cooling system. Several different liquid-cooling methods have been proposed in the field of cooling high power dissipating electronic components mounted on printed circuit boards. A typical processor board can contain a multiplicity of CPU modules with associated cache memory, ASICs, and DC-DC converters. The total power dissipation from a similarly configured board can reach more than 600 W. Similar components can exist on each side of a board. With microprocessor power dissipation continuing to increase while the space available for a thermal solution decreases, it becomes necessary to improve heat dissipation by the CPU and associated components. One such improvement is a single-phase forced-liquid cooling system.

The primary components of a single-phase forced-liquid cooling system are a pump, a heat exchanger, a liquid-cooled cold plate and some associated tubing required to interconnect the components and put them in fluid communication (i.e., provide passageways and/or orifices for fluid to travel between the components). Heat is dissipated by the microprocessor, and/or other power consuming component, and transferred to the liquid circulating through the cold plate, with which the component is in intimate contact. The liquid increases in temperature without changing its phase as it absorbs heat. The liquid is then moved to a heat exchanger, via the pump, where the heat is transferred to ambient air, resulting in a reduction in temperature of the liquid. The cycle is repeated when the liquid re-enters the cold plate. One of the more popular liquid-cooling mechanisms employs an aluminum cover assembly that mounts to a circuit board in overlaying close-fitting relationship to the surface-mounted electronics. This kind of cooling apparatus is commonly referred to as a cold plate.

Conventional cold plates typically comprise a relatively flat thermally conductive body formed with an engagement surface that closely mirrors the surface configuration or topology of the circuit board. An internal cooling channel is formed in the plate to circulate cooling fluid through the body and draw heat away from the cold plate during operation. The plate mounts to the circuit board using separate mechanical hardware, e.g., spring loaded clips and the like, with the respective electronic components often nested in corresponding close-fitting recesses. While conventional cold plates offer significant cooling advantages for printed circuit boards, as compared to air-cooled systems, some of the drawbacks involve cost and reliability. Typically, the costs associated with cold plates often reflect long lead times and complex manufacturing operations, which most often may lead to lower reliability. Consequently the expense to employ a traditional cold plate system and its associated mounting hardware, coupled with reliability issues in a printed circuit board environment, is often undesirably high cost and lower reliability.

In an effort to address these problems, those skilled in the art have advanced many proposals for design and manufacturing cold plates. For example, in U.S. Pat. No. 6,305,463, issued to Salmonson, discloses a cold plate that provides air or liquid cooling for a computer circuit module and has at least one mounting plate with a board mounting surface on one side for carrying a printed circuit board assembly and a cooling surface located on the other side. A cover is disposed parallel to and spaced apart from the mounting plate with a cooling chamber defined between the two. U.S. Pat. No. 6,587,343 issued to Novotny, et al., discloses a water-cooled system and method for cooling electronic components. The system includes a surface with at least one electronic component coupled to the surface, where the at least one electronic component includes an integrated circuit. A closed-loop fluidic circuit is coupled to the surface for removing heat from the integrated circuit. The closed-loop fluidic circuit includes a heat exchanger. U.S. Pat. No. 5,050,037, issued to Yamamoto, et al., discloses a printed circuit board assembly having a printed circuit board mounted, on both faces with heat generative electronic circuit components, such as integrated circuit chips, and a pair of liquid-cooling modules arranged on both sides of the printed circuit board. Each of the liquid-cooling modules is provided with a liquid cooling plate having liquid coolant supply heads and a plurality of resilient heat transfer units held by the liquid-cooling plate and arranged in compressive contact with the electronic circuit components on both faces of the printed circuit board.

What is needed and has been heretofore unavailable is a high-performance, cost-effective cold plate configuration that lends itself to a high level of manufacturability, and a method that implements straightforward design and fabrication steps to minimize costs and production delays, which in turn simplifies the design of the cooling system, and its components. The cold plate of the present invention satisfies these needs.

SUMMARY OF THE INVENTION

The present invention provides a system for cooling electronic components with a surface having one or more electronic components, including an integrated circuit, mounted thereon. A liquid cooled heat exchanger located in overlying contacting relation with the integrated circuit. A resilient cold plate coupled to the surface so as to be biased by a portion of the liquid cooled heat exchanger thereby providing a forced or fully loaded engagement between the liquid cooled heat exchanger, the integrated circuit, and the resilient cold plate.

In another embodiment of the invention, a system for cooling electronic components is provided that includes a surface, e.g., the surface of a printed wiring board, with one or more electronic components, including an integrated circuit, mounted on the surface. A liquid cooled heat exchanger is located in overlying contacting relation with the integrated circuit. A resilient cold plate is coupled to the surface in overlying contacting relation with the one or more electronic components and so as to be biased by a portion of the liquid cooled heat exchanger thereby providing a forced engagement between the liquid cooled heat exchanger, the one or more electronic components, and the resilient cold plate.

In a further embodiment of the present invention, a system for cooling electronics is provided having a first surface and a second surface, e.g., the top and bottom surfaces of a printed wiring board, with one or more electronic components including an integrated circuit mounted on at least the first surface. A liquid cooled heat exchanger is located in overlying contacting relation with the integrated circuit. A first resilient cold plate is coupled to the first surface in overlying contacting relation with the one or more electronic components and so as to be biased by a portion of the liquid cooled heat exchanger thereby providing a forced engagement between the liquid cooled heat exchanger, the one or more electronic components, and the first resilient cold plate. A second resilient cold plate coupled to the second surface and the first resilient cold plate so s to provide additional spring force to the system and thereby to enhance thermal transfer.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein:

FIG. 3 is a cross-sectional view of the liquid cooled heat exchanger shown in FIG. 2;

FIG. 4 is another cross-sectional view of the liquid cooled heat exchanger shown in FIG. 2;

DETAILED DESCRIPTION OF THE PREFERRED EMBODIMENT

Figure 1:
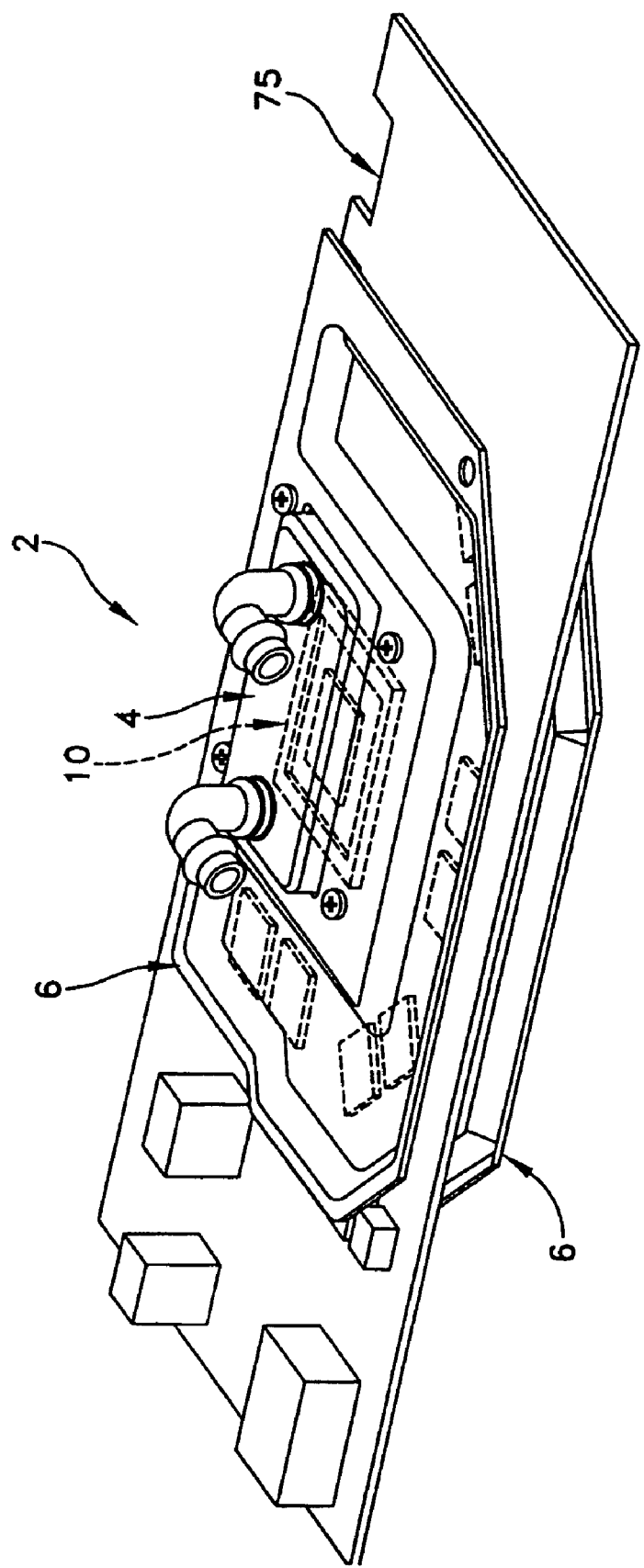
FIG. 1 is a perspective view of a system for cooling electronic components formed in accordance with one embodiment of the present invention.
Figure 2:
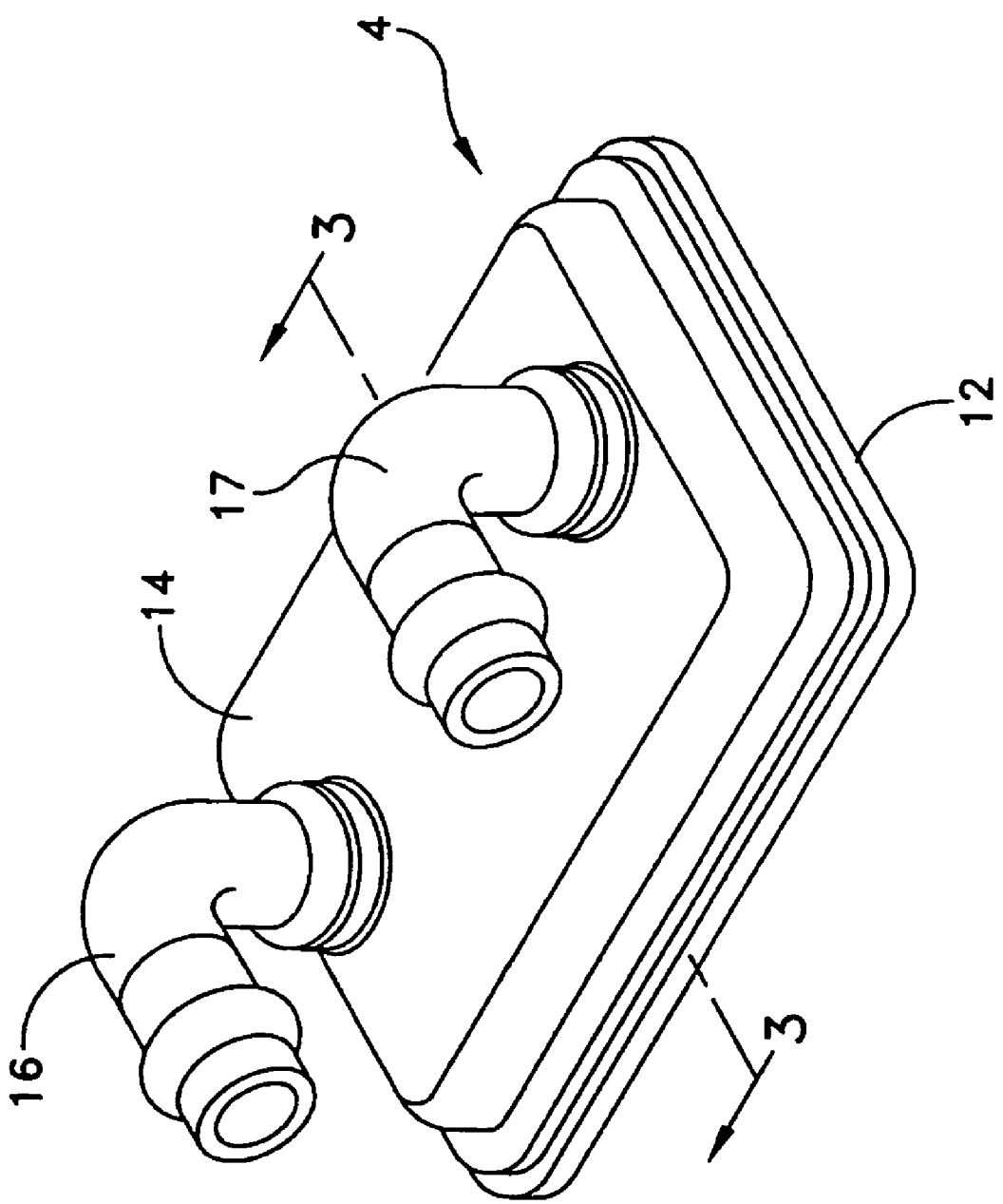
FIG. 2 is a perspective view of a liquid cooled heat exchanger.
Figure 5:
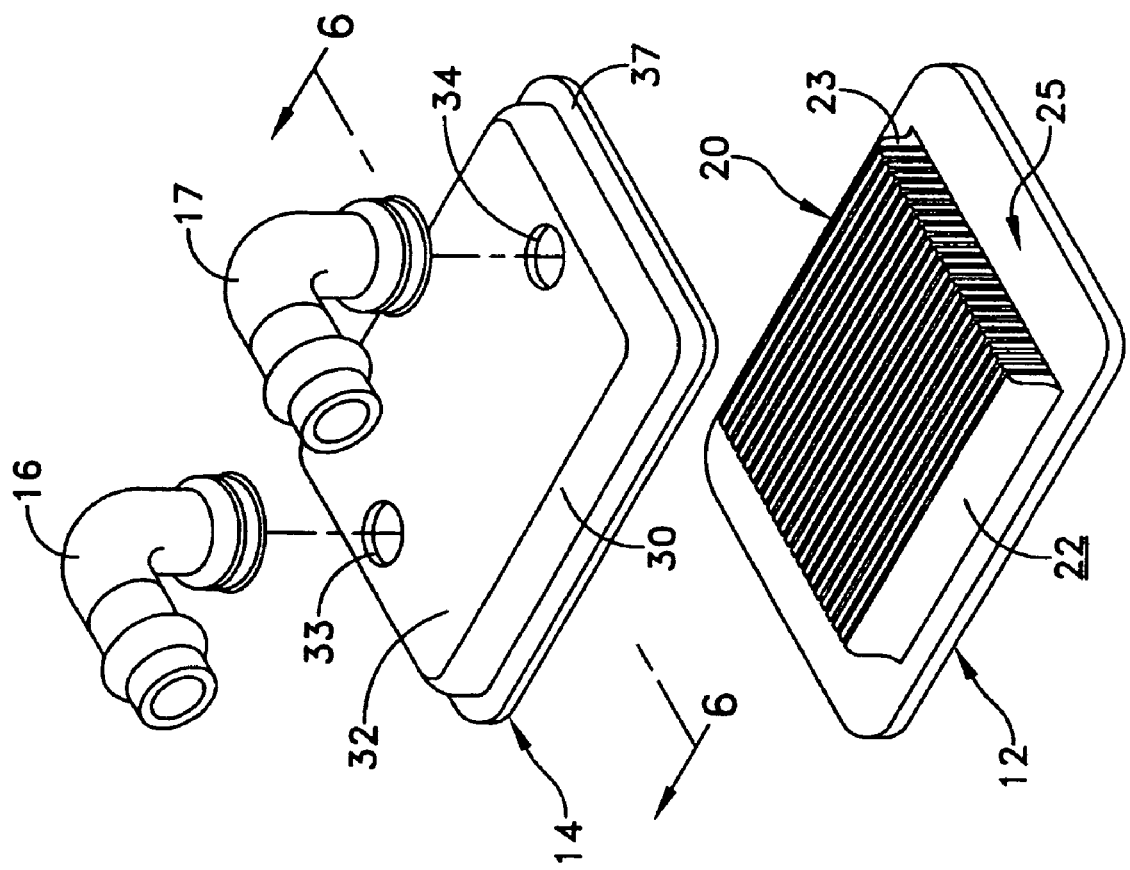
FIG. 5 is an exploded perspective view of the liquid cooled heat exchanger shown in FIG. 2.
Figure 6:
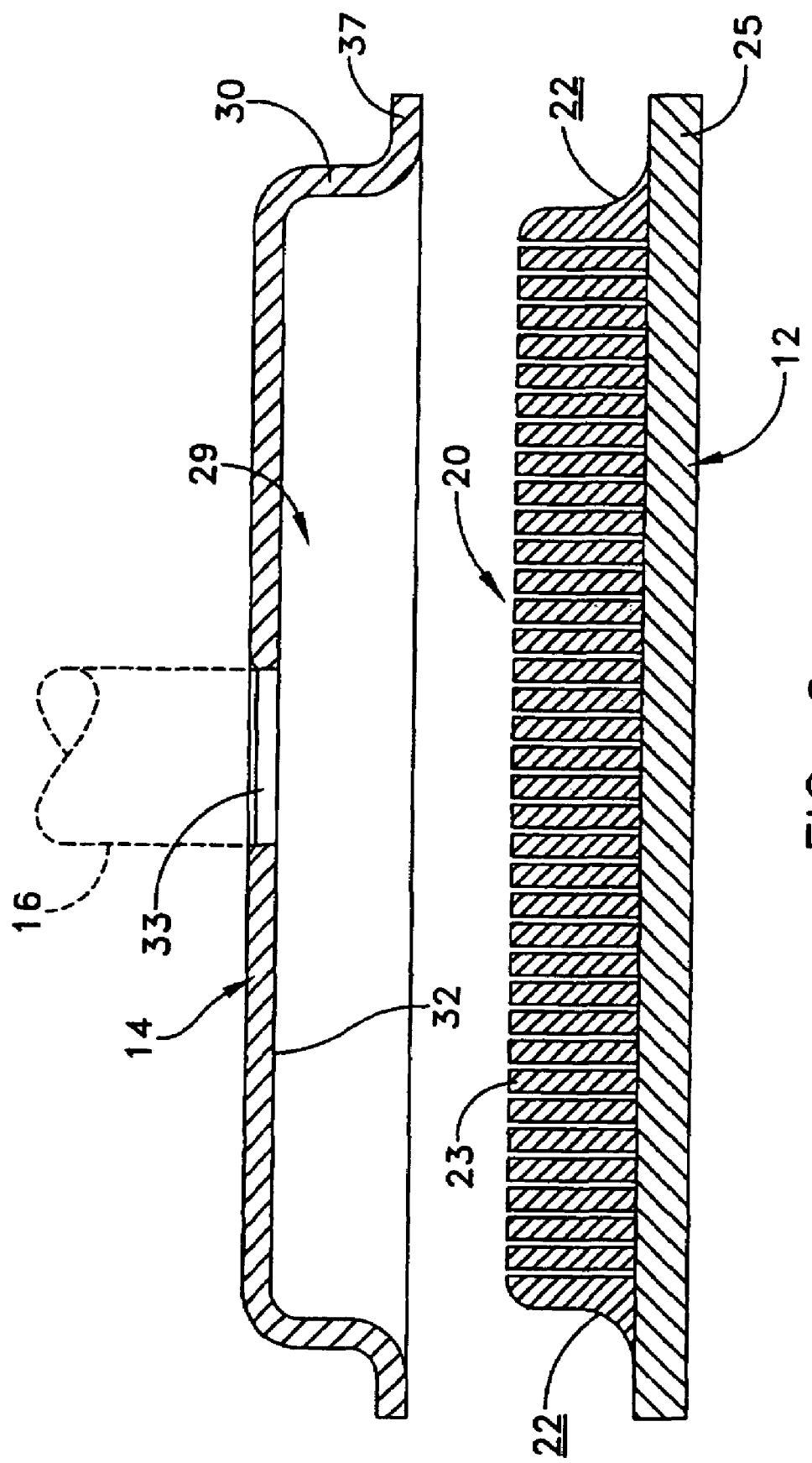
FIG. 6 is an exploded cross-sectional view of the liquid cooled heat exchanger shown in FIG. 2.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top " and "bottom " as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal " versus "lateral " and the like are to be interpreted relative to one another or relative to an axis of elongation, or an axis or center of rotation, as appropriate. Terms concerning attachments, coupling and the like, such as "connected " and "interconnected," refer to a relationship wherein structures are secured or attached to one another either directly or indirectly through intervening structures, as well as both movable or rigid attachments or relationships, unless expressly described otherwise. The term "operatively connected " is such an attachment, coupling or connection that allows the pertinent structures to operate as intended by virtue of that relationship. In the claims, means-plus-function clauses, if used, are intended to cover the structures described, suggested, or rendered obvious by the written description or drawings for performing the recited function, including not only structural equivalents but also equivalent structures.

Figure 7:
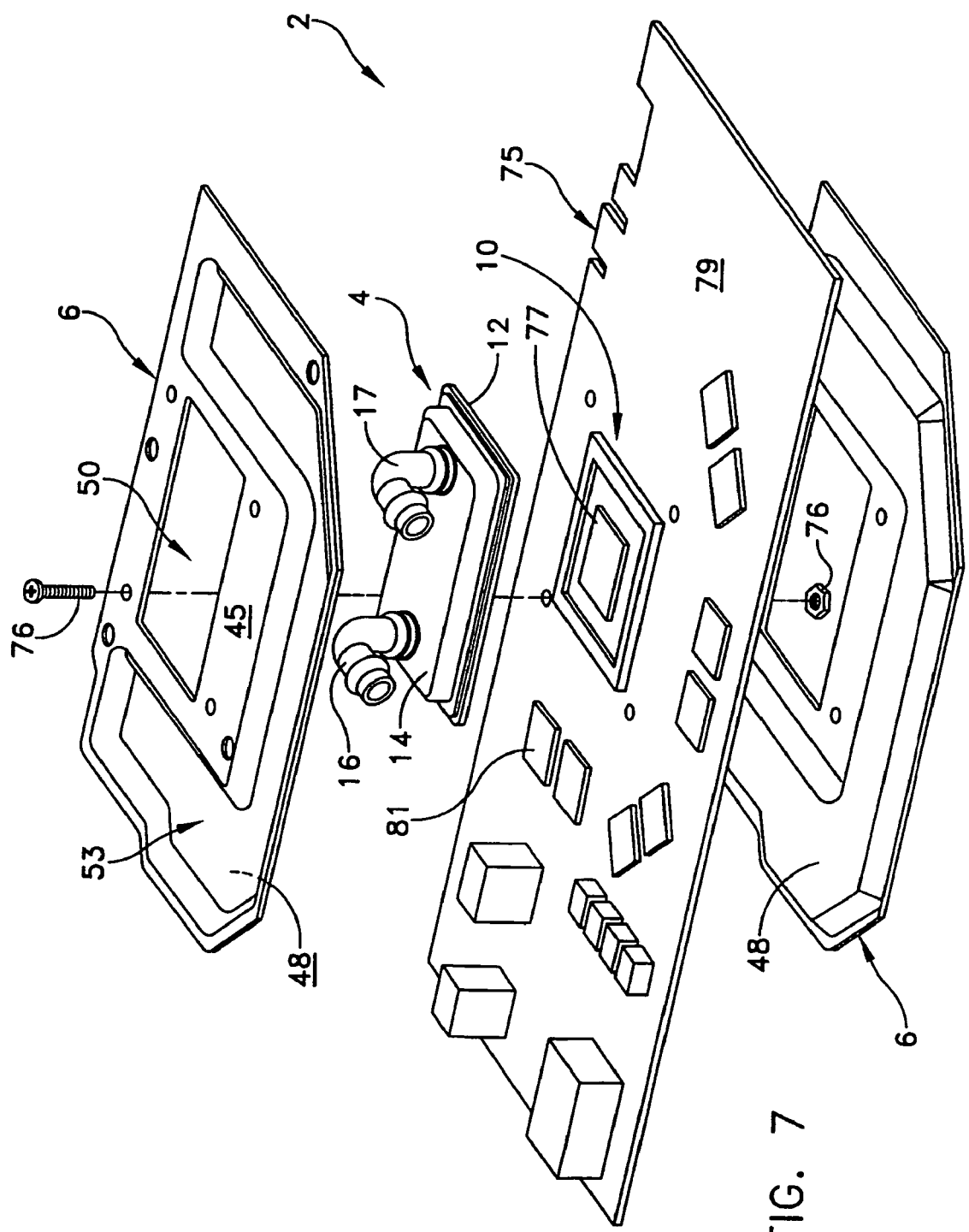
FIG. 7 is an exploded perspective view of a system for cooling electronic components formed in accordance with one embodiment of the present invention.

Referring to FIGS. 1 and 7-9, a thermal management system 2 formed in accordance with the present invention comprises a liquid cooled heat sink 4 and at least one cold plate 6 that acts not only to distribute thermal energy within the system, but also to retain liquid cooled heat sink 4 in intimate thermal engagement with a heat generating device 10 (FIGS. 1 and 7). More particularly, liquid cooled heat sink 4 comprises a base plate 12, a lid 14, a first conduit 16 and a second conduit 17. A plurality of fins 20 project outwardly from a top surface of base plate 12, and are often arranged in mutually parallel relation to one another. End ones of fins 20 include a radiused outer surface 22. Plurality of fins 20 have a length and width that is less than the length and width of base plate 12 so that a circumferential portion of base plate 12 forms a flange 25 that extends outwardly from all sides of plurality of fins 20.

Lid 14 includes a central depression 29 defined by a circumferential wall 30 that is bounded by a central top wall 32. Two through-bores 33,34 are defined by top wall 32 in spaced apart relation to one another. A circumferential flange 37 extends outwardly from all sides of lid 14 and away from the central depression 29. Lid 14 is assembled to base plate 12 so that plurality of fins 20 are housed within the central depression formed in lid 14, with a first manifold 40 and a second manifold 42 defined between circumferential wall 30 and the ends of plurality of fins 20. In this construction, through-bore 33 is located above first manifold 40 and through-bore 34 is located above second manifold 42, with first conduit 16 assembled in fluid communication with through-bore 33 and second conduit 17 assembled in fluid communication with through-bore 34. As a result, a cooling fluid (not shown) may be forced through one of the conduits, through plurality of fins 20 and out the other conduit so as to effect heat transfer from liquid cooled heat sink 4.

Figure 8:
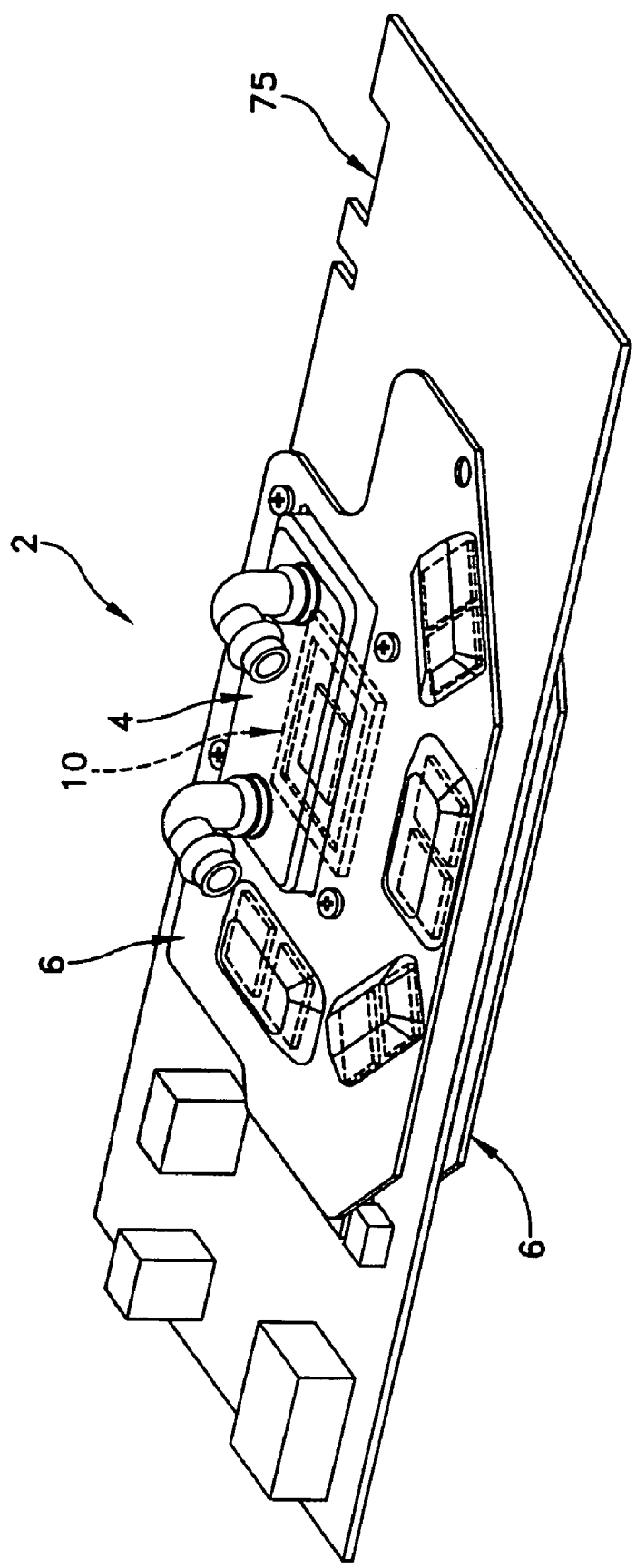
FIG. 8 is an assembled view of the system for cooling electronic components shown in FIG. 7.
Figure 9:
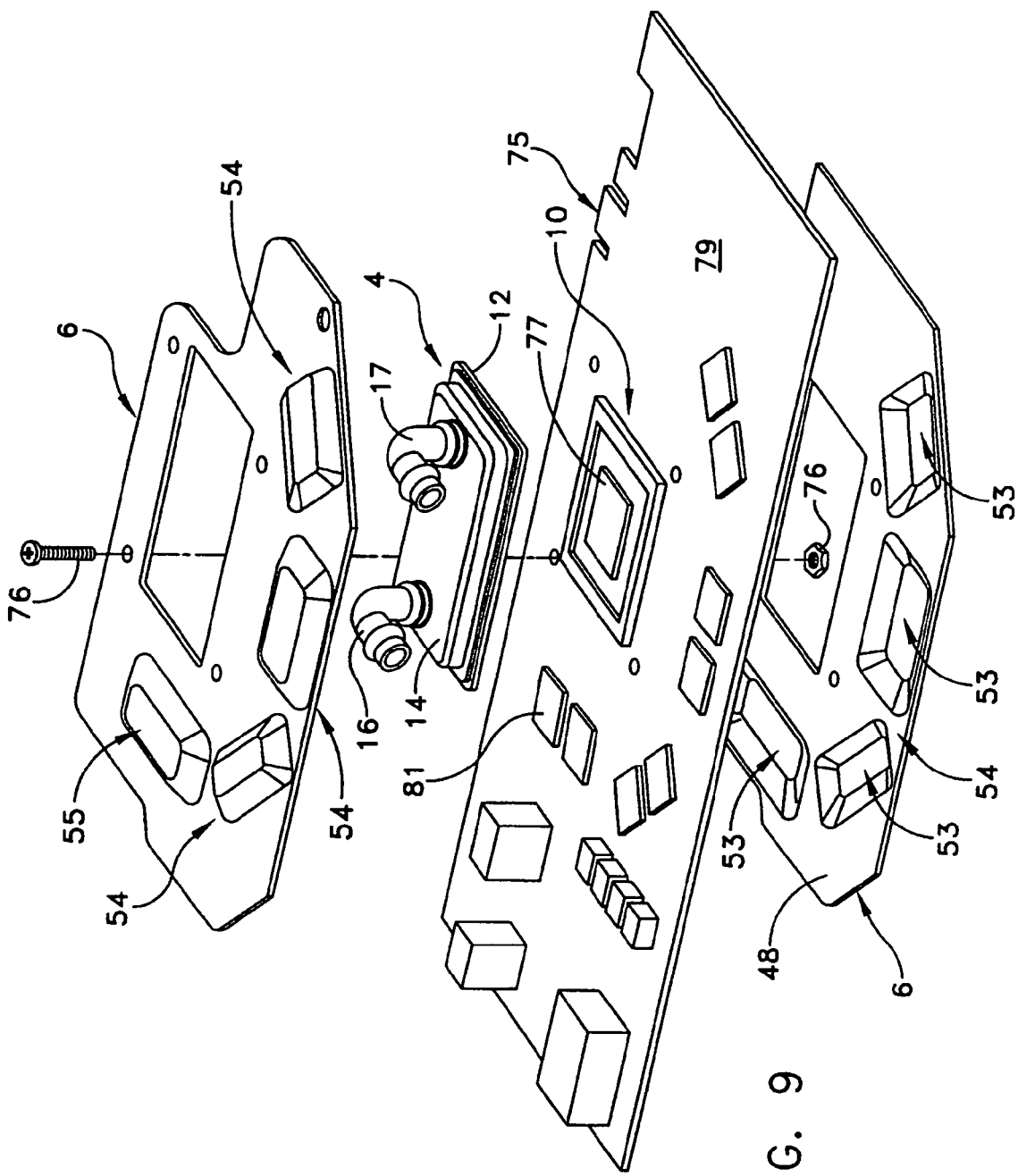
FIG. 9 is an exploded perspective view of a system for cooling electronic components formed in accordance with an alternative embodiment of the present invention.

Referring to FIGS. 7-9, cold plate 6 is formed from a sheet of thermally conductive, resilient metal that has a top surface 45, a bottom surface 48, an opening 50 defined by a peripheral edge 51 through its thickness, and at least one depression 53. Cold plate 6 preferably possesses spring characteristics that allow for the storage of elastic energy when a portion of the plate is biased or loaded, i.e., deflected in a spring-like fashion so that a force or load is exerted by cold plate 6 in response to the deflection. This spring-like response to engagement with other structures, e.g., flange 25 of base 12 of liquid cooled heat sink 4, allows for improved thermal conduction across the interface at the region of contact. In particular, opening 50 of cold plate 6 is sized so as not to receive the outer portion of top wall 32 of lid 14 and a portion of its entire circumferential wall 30, but instead flange 25 of base plate 12 or circumferential flange 37 of lid 14. One or more depressions 53 are often formed as one or more deep draws in top surface 45 of cold plate 6 that form prominences 55 on bottom surface 48. Depressions 53 (like depression 29 defined in lid 14) may be formed by several alternative manufacturing methods including, but not limited to stamping, machining, and casting, etc.

Thermal management system 2 is typically used in conjunction with at least one printed wiring board, e.g., a videographics processing card 75, having a processing unit 77 positioned on a top surface 79 of printed wiring card 75, with one or more other semiconductor devices, e.g., graphics memory modules 81, distributed around the perimeter of processing unit 77. Thermal management system 2 is assembled to videographics processing card 75 by positioning liquid-cooled heat sink 4 in overlying thermal engagement with the top surface of processing unit 77. In this arrangement, lid 14 and conduits 16, 17 stand proud of surface 79 and processing unit 77. In this way, the bottom surface of base plate 12 is disposed in intimate thermal communication with the top surface of processing unit 77.

Figure 10:
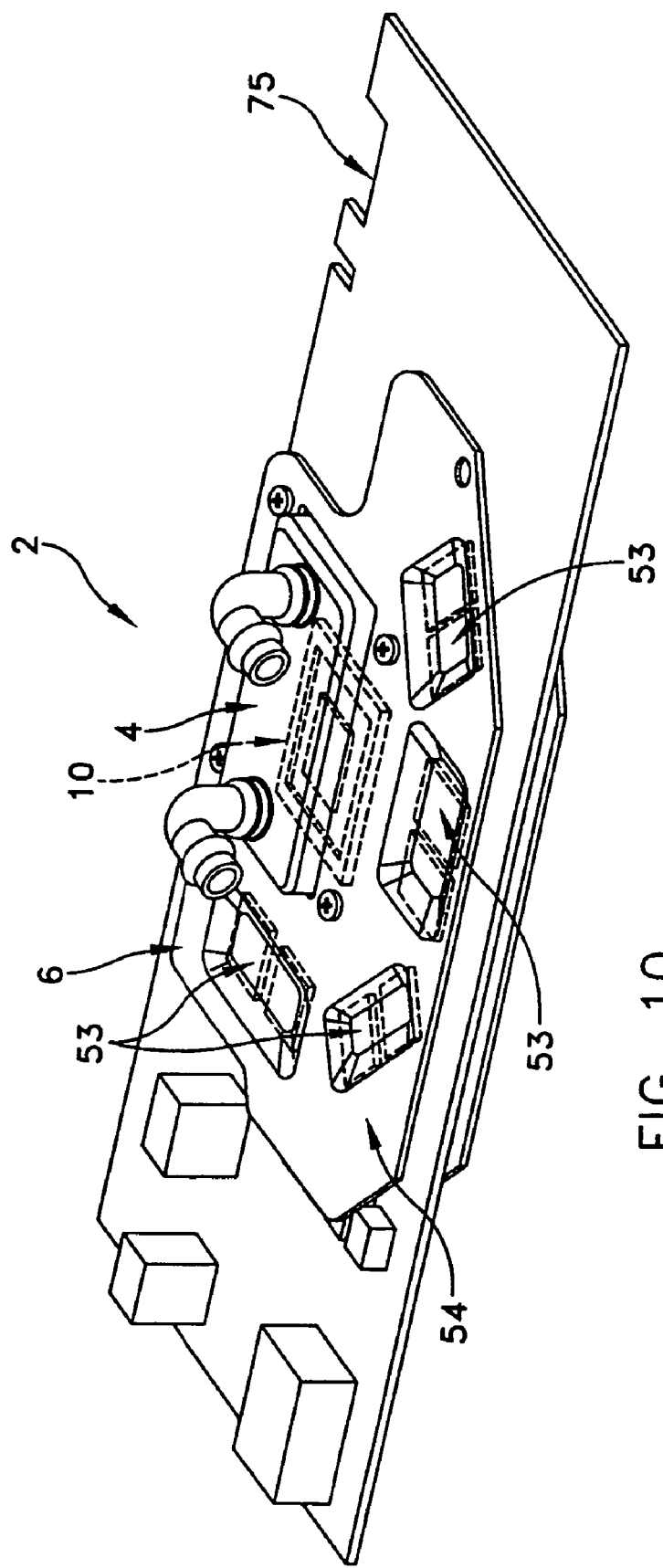
FIG. 10 is an exploded perspective view of another embodiment of a system for cooling electronic components formed in accordance with the present invention.

Once in this position, at least one cold plate 6 is positioned in confronting relation to top surface 79 of videographics processing card 75 such that opening 50 is arranged in coaxial relation with liquid-cooled heat sink 4. In this position, bottom surface 48 on prominence 55 is disposed in confronting spaced relation to peripheral semiconductor devices 81 (FIG. 10). To complete assembly, cold plate 6 is moved toward videographics processing card 75 such that conduits 16 and 17 along with the top portion of lid 14 and top wall 32 pass through opening 50. Cold plate 6 moves toward videographics processing card 75 until the portion of bottom surface 48 that is adjacent to peripheral edge 51 defining opening 50 engages flange 25 of base plate 12. At the same time, bottom surface 48 on prominences 55 engage the top surfaces of each of the peripheral semiconductor devices 81. It is often preferable to deposit a thermal interface material, e.g., thermal grease or sheet of thermally conductive material, or the like, on one or both of the thermally engaging surfaces to improve thermal transfer across the interface, and to accommodate the varying heights of electronic components located on videographics processing card 75. Thermal management system 2 is then clamped to videographics processing card 75 by conventional fasteners, e.g., threaded bolt or screw fasteners 76, of the type well-known in the art. Very often, a second cold plate 6 is arranged in confronting relation on a bottom surface of videographics processing card 75 and is clamped to printed wiring board 75 by the same fasteners used to clamp the top cold plate 6.

As a result of this construction, that portion of cold plate 6 that engages flange 25 of base plate 12 deflects, thereby storing elastic energy and providing a contact force operative against flange 25. In this way, an intimate thermal engagement is maintained between cold plate 6 and base plate 12 of liquid-cooled heat sink 4 so as to enhance thermal transfer, while at the same time, acting as a retention mechanism for maintaining liquid-cooled heat sink 4 in position and contact with processing unit 77. At the same time, prominences 55 are forced against peripheral semiconductor devices 81 by the same stored elastic energy generated by fasteners. As a result, cold plate 6 is also maintained in intimate thermal engagement with each of the peripheral semiconductor devices, whose thermal energy is transferred, via conduction, through cold plate 6 to flange 25 and thereby to plurality of fins 20 to be dissipated as cooling fluid washes across plurality of fins 20 from manifold 40 to manifold 42. In one embodiment of the invention, a substantially U-shaped plurality of depressions 54 are disposed in cold plate 6 that each positionally correspond to the position of a heat generating device 81 located on videographics processing card 75.

It is to be understood that the present invention is by no means limited only to the particular constructions herein disclosed and shown in the drawings, but also comprises any modifications or equivalents within the scope of the claims.

What is claimed is:

1. A system for cooling electronic components, said system comprising:
   a surface;
   at least one electronic component mounted on the surface;
   a resilient cold plate; and
   a liquid cooled heat exchanger in thermal communication with the resilient cold plate and the at least one electronic component;
   wherein the resilient cold plate is resiliently deformed to a state in which the resilient cold plate exerts an inherent biasing force against the liquid cooled heat exchanger.

2. A system according to claim 1, wherein the liquid cooled heat exchanger includes a base plate having a plurality of fins projecting outwardly from a top surface.

3. A system according to claim 2, wherein the plurality of fins are arranged in mutually parallel relation to one another.

4. A system according to claim 2, wherein end ones of the fins include a radiused outer surface.

5. A system according to claim 2, wherein the plurality of fins have a length and width that is less than a length and a width of the base plate so that a circumferential portion of the base plate forms a flange that extends outwardly from all sides of the plurality of fins.

6. A system according to claim 2, wherein the liquid cooled heat exchanger includes a lid positioned in overlying relation to the base plate, and includes a first conduit and a second conduit.

7. A system according to claim 6, wherein the lid includes a central depression defined by a circumferential wall that is bounded by a central top wall.

8. A system according to claim 7, wherein the lid defines two through-bores in the top wall that are arranged in spaced apart relation to one another.

9. A system according to claim 8, wherein the lid includes a circumferential flange that extends outwardly from all sides of the lid and away from the central depression.

10. A system according to claim 6, wherein the lid is assembled to the base plate so that the plurality of fins are located within a central depression defined by a circumferential wall that is bounded by a central top wall of the lid.

11. A system according to claim 10, wherein the lid, the base plate, and the fins define a first manifold and a second manifold.

12. A system according to claim 2, wherein the cold plate is formed from a sheet of thermally conductive, resilient metal having a top surface, a bottom surface, an opening defined by a peripheral edge through a thickness, and at least one depression.

13. A system according to claim 1, wherein the cold plate stores energy when deflected in a spring-like fashion so that a force or load is exerted by the cold plate in response to deflection.

14. A system according to claim 12, wherein the plurality of fins have a length and width that is less than a length and a width of the base plate so that a circumferential portion of the base plate forms a flange that extends outwardly from all sides of the plurality of fins and deflects the cold plate in a spring-like fashion.

15. A system according to claim 1, wherein the resilient cold plate includes at east one depression formed in a top surface so as to define a prominence protruding from a bottom surface.

16. A system according to claim 1 wherein said surface forms a portion of a printed wiring board.

17. A system according to claim 1 wherein said one or more electronic components comprise graphics memory modules distributed around a perimeter of said integrated circuit.

18. A system according to claim 1 wherein said resilient cold plate includes a plurality of depressions that are formed in a top surface so as to define a plurality of prominences protruding from a bottom surface.

19. A method for cooling electronic components, the method comprising the steps of:
  mounting at least one electronic component on a surface;
  coupling a liquid cooled heat exchanger to the surface in a position in thermal communication with the at least one electronic component;
  exerting a biasing force upon at least one of the liquid cooled heat exchanger and the electronic component by deformation of a resilient cold plate.

* * * * *